US009348950B2

(12) United States Patent
Hodgins et al.

(10) Patent No.: US 9,348,950 B2
(45) Date of Patent: May 24, 2016

(54) PERCEPTUALLY GUIDED CAPTURE AND STYLIZATION OF 3D HUMAN FIGURES

(71) Applicant: Disney Enterprises, Inc., Burbank, CA (US)

(72) Inventors: Jessica Kate Hodgins, Pittsburgh, PA (US); Edilson DeAguiar, Jaguare (BR); Lavanya Sharan, Pittsburgh, PA (US); Moshe Benjamin Mahler, Pittsburgh, PA (US); Ariel Shamir, Jerusalem (IL)

(73) Assignee: Disney Enterprises, Inc., Burbank, CA (US)

( * ) Notice: Subject to any disclaimer, the term of this patent is extended or adjusted under 35 U.S.C. 154(b) by 61 days.

(21) Appl. No.: 14/189,393

(22) Filed: Feb. 25, 2014

(65) Prior Publication Data

US 2014/0180647 A1 Jun. 26, 2014

Related U.S. Application Data

(63) Continuation of application No. 13/407,606, filed on Feb. 28, 2012, now Pat. No. 8,737,767.

(51) Int. Cl.
| | | |
|---|---|---|
| *G06K 9/00* | (2006.01) | |
| *G06F 17/50* | (2006.01) | |
| *G06T 17/00* | (2006.01) | |

(52) U.S. Cl.
CPC ............... *G06F 17/50* (2013.01); *G06T 17/00* (2013.01)

(58) Field of Classification Search
CPC ................................ G06F 17/50; G06T 15/20

USPC ............................................... 703/1; 382/103
See application file for complete search history.

(56) References Cited

U.S. PATENT DOCUMENTS

| | | | | |
|---|---|---|---|---|
| 2008/0298643 | A1* | 12/2008 | Lawther et al. | 382/118 |
| 2009/0129630 | A1* | 5/2009 | Gloudemans et al. | 382/103 |
| 2013/0226528 | A1 | 8/2013 | Hodgins et al. | |
| 2013/0271451 | A1* | 10/2013 | Tong et al. | 345/419 |
| 2013/0330060 | A1* | 12/2013 | Seidel et al. | 386/280 |

OTHER PUBLICATIONS

A Morphable Model for the Synthesis of 3D Faces. Volker Blanz and Thomas Vetter. 1999.*
A Morphable Model for the Synthesis of 3D Faces-PowerPoint. Volker Blanz and Thomas Vetter. 2000.*

(Continued)

*Primary Examiner* — Stephen R Koziol
*Assistant Examiner* — Delomia L Gilliard
(74) *Attorney, Agent, or Firm* — Patterson + Sheridan, LLP

(57) ABSTRACT

One embodiment of the present invention sets forth a technique for generating a three-dimensional (3D) model of an individual. The technique involves receiving pose data that includes image data associated with the individual being in a pose, selecting from a database a morphable 3D generic human model based on a gender of the individual, adjusting a pose of the morphable 3D generic model based on the image data, identifying, based on the image data, one or more 3D appearance parameter objects included in the database, and adjusting via one or more processors one or more properties of the morphable 3D generic model based on the image data as well as the one or more 3D appearance parameter objects to produce the 3D model of the individual.

17 Claims, 5 Drawing Sheets

(56) References Cited

OTHER PUBLICATIONS

Style-Based Inverse Kinematics. Keith Grochow, Steven L. Martin, Aaron Hertzmann and Zoran Popovic. 2004.*

Caesar, 2002. Civilian american and european surface anthropometry resource project, http://store.sae.org/caesar/.

Allen, B., Curless, B., and Popovi'c 630 , Z. 2003. The space of human body shapes: reconstruction and parameterization from range scans. ACM Trans. Graph. 22.

Ganapathi, V., Plagemann, C., Koller, D., and Thrun, S. 2010. Real time motion capture using a single time-of-flight camera. In Proceedings of IEEE CVPR.

Zhou, S., Fu, H., Liu, L., Cohen-Or, D., and Han, X. 2010. Parametric reshaping of human bodies in images. ACM Trans. Graph. 29.

Jain, A., Thormahlen, T., Seidel, H.-P., and Theobalt, C. 2010. Moviereshape: tracking and reshaping of humans in videos. ACM Trans. Graph. 29.

Tena, J., Hamouz, M., Hilton, A., and Illingworth, J. 2006. A validated method for dense non-rigid 3d face registration. Proceedings of IEEE AVSBS 0.

Saragih, J., Lucey, S., and Cohn, J. 2011. Deformable model fitting by regularized landmark mean-shifts. IJVC (in press).

Ju, T., Schaefer, S., and Warren, J. 2005. Mean value coordinates for closed triangular meshes. ACM Trans. Graph. 24.

Byrd, R. H., Lu, P., Nocedal, J., and Zhu, C. 1995. A limited memory algorithm for bound constrained optimization. SIAM J. Sci. Comput. 16.

* cited by examiner

PERCEPTUALLY GUIDED CAPTURE AND STYLIZATION OF 3D HUMAN FIGURES

CROSS-REFERENCE TO RELATED APPLICATION

This application is a continuation of U.S. patent application Ser. No. 13/407,606, filed Feb. 28, 2012. The aforementioned related patent application is herein incorporated by reference in its entirety.

BACKGROUND

1. Field of the Invention

Embodiments of the invention relate to graphics processing and, in particular, to a system and method for performing a perceptually guided capture and stylization of 3D human figures.

2. Description of the Related Art

In recent years, capturing three-dimensional (3D) models of human figures has been a major effort the area of computer graphics and modeling. A variety of professional devices that capture 3D models of human figures include multiple-camera setups, infrared depth cameras, laser scanners, and the like. Such professional 3D capture devices typically enable an attached computer system to acquire high-resolution photometric and/or and geometric properties of human subjects. Unfortunately, these devices are often high in complexity and cost, which makes them generally unavailable to and/or usable by consumers.

In response to the foregoing deficiencies, several companies have developed consumer-level 3D capture devices that are significantly simpler in construction and relatively inexpensive to manufacture. One example of a consumer-level 3D capture device is Microsoft's® Kinect™ device, which outputs various information including an RGB image of a scene, a depth-map image of the scene, a kinematic skeleton of one or more individuals in the scene, and the like. In contrast to the professional 3D capture devices, the data output by the consumer-level 3D capturing devices generally is low in resolution. Typically, such low-resolution data can be processed to calculate and determine a variety of useful information, such as the movement of a user's arms, body and head, which can be used to, for example, control a character in a video game. Unfortunately, however, it remains difficult to construct usable 3D human models from such low-resolution data.

As the foregoing illustrates, there is a need in the art for an improved technique for capturing 3D models of humans using low-resolution 3D capturing devices.

SUMMARY

One embodiment of the invention provides a method for generating a three-dimensional (3D) model of an individual. The method includes receiving pose data that includes image data associated with the individual being in a pose, selecting from a database a morphable 3D generic human model based on a gender of the individual, adjusting a pose of the morphable 3D generic model based on the image data, identifying, based on the image data, one or more 3D appearance parameter objects included in the database, and adjusting via one or more processors one or more properties of the morphable 3D generic model based on the image data as well as the one or more 3D appearance parameter objects to produce the 3D model of the individual.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF EXEMPLARY EMBODIMENTS

Embodiments of the invention provide techniques for processing pose data that corresponds to an individual in a candid pose to generate a 3D data model of the individual. In particular, the 3D data model of the individual retains enough detail so that the 3D data model can easily be recognized as the individual on whom the 3D data model is based. Such 3D data models may be used in a variety of applications, including being inserted as an interactive 3D avatar in virtual worlds (e.g., video games), being inserted as an animated 3D avatar in virtual worlds (e.g., animated movies), being rendered as a 3D model in a static 2D image, being projected according to 3D projection techniques (e.g., lenticular printing, holograms, 3D displays, stereograms, etc.), and being printed as toys or souvenirs using rapid prototyping systems (e.g., 3D printers that use different materials such as plastics, metals, and edibles (e.g., chocolate, sugar, etc.) from which to construct the 3D data model).

Figure 1:
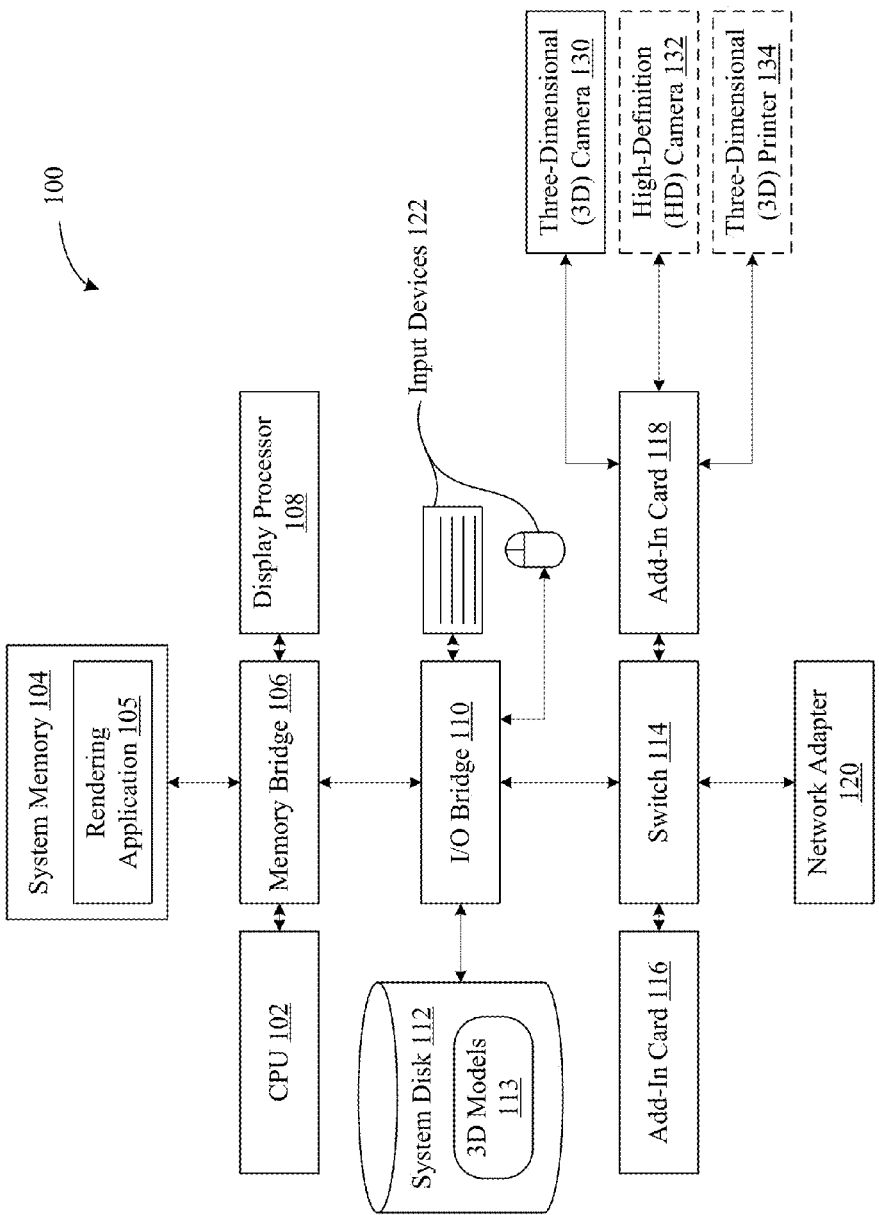
FIG. 1 is a block diagram of a system configured to implement one or more aspects of the invention.

FIG. 1 is a block diagram of a system 100 configured to implement one or more aspects of the invention. System 100 may be a computer workstation, personal computer, video game console, or any other device suitable for practicing one or more embodiments of the present invention.

As shown, system 100 includes a central processing unit (CPU) 102 and a system memory 104 communicating via a bus path that may include a memory bridge 106. CPU 102 includes one or more processing cores, and, in operation, CPU 102 is the master processor of system 100, controlling and coordinating operations of other system components. System memory 104 stores software applications and data for use by CPU 102, such as rendering application 105 used to generate 3D data models of individuals. CPU 102 runs software applications and optionally an operating system. Memory bridge 106 is connected via a bus or other communication path to an I/O (input/output) bridge 110. I/O bridge 110 receives user input from one or more user input devices 122 (e.g., keyboard, mouse, joystick, digitizer tablets, touch pads, touch screens, still or video cameras, motion sensors, and/or microphones) and forwards the input to CPU 102 via memory bridge 106.

A display processor 108 is coupled to memory bridge 106 via a bus or other communication path. In one embodiment, display processor 108 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 104. Display processor 108 periodically delivers pixels to a display device. In some embodiments, the display device is a projector, such as an LCD projector, DLP projector, or the like. Display processor 108 can provide display device with an analog or digital signal.

A system disk 112 is also connected to I/O bridge 110 and may be configured to store content and applications and data for use by CPU 102 and display processor 108. In one embodiment, system disk 112 includes 3D models library 113, which includes a collection of morphable 3D generic data models that are used by rendering application 105 to implement the techniques described herein. System disk 112 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 114 provides connections between I/O bridge 110 and other components such as a network adapter 120 and various add-in cards 116 and 118. As shown, the add-in card 118 is connected to a three-dimensional (3D) camera 130, which is configured to provide to rendering application 105 various pose data, such as red/green/blue (RGB) images of an individual in a candid pose, depth map images of the individual in the candid pose, and kinematic skeleton data of the individual in the candid pose. Any 3D camera 130—both consumer grade and professional grade—may be used to implement aspects of the invention. One example of a consumer grade 3D camera 130 is Microsoft's® Kinect™ device, which outputs a low-resolution 640×480 pixel RGB image, a low-resolution 640×480 pixel depth map image, and kinematic skeleton data of one or more individuals that are within the field of view of the Kinect™ device.

Also shown in FIG. 1 are an optional high-definition (HD) camera 132 and an optional 3D printer 134. The HD camera 132, if connected to system 100, is used to capture an HD image that is used in place of the low-resolution RGB image that is typically provided by 3D camera 130. In this way, detailed appearance parameters of an individual may be extracted from the HD image by rendering application 105, e.g., hair color, skin tone, clothing, and the like, which normally cannot accurately be extracted from the low-resolution images output by 3D camera 130. Future upgrades, however, of 3D camera 130 may enable 3D camera 130 to capture such HD images, e.g., 1280×720 pixel images, which would obviate the need for HD camera 132 and reduce the overall cost and complexity of system 100.

3D printer 134 is optionally connected to system 100 and is configured to produce physical, small-scale 3D printouts of 3D data models of individuals that are generated by rendering application 105, as described herein.

Network adapter 120 allows system 100 to communicate with other systems via an electronic communications network, and may include wired or wireless communication over local area networks and wide area networks such as the Internet. Other components (not shown), including USB or other port connections, film recording devices, and the like, may also be connected to I/O bridge 110. For example, an audio processor may be used to generate analog or digital audio output from instructions and/or data provided by CPU 102, system memory 104, or system disk 112. Communication paths interconnecting the various components in FIG. 1 may be implemented using any suitable bus or point-to-point communication protocol(s), and connections between different devices may use different protocols, as is known in the art.

In one embodiment, display processor 108 incorporates circuitry optimized for graphics and video processing, including, for example, video output circuitry, and constitutes a graphics processing unit (GPU). In another embodiment, display processor 108 incorporates circuitry optimized for general purpose processing. In yet another embodiment, display processor 108 may be integrated with one or more other system elements, such as the memory bridge 106, CPU 102, and I/O bridge 110 to form a system on chip (SoC). In still further embodiments, display processor 108 is omitted and software executed by CPU 102 performs the functions of display processor 108.

Pixel data can be provided to display processor 108 directly from CPU 102. In some embodiments of the present invention, instructions and/or data representing a scene are provided to a render farm or a set of server computers, each similar to system 100, via network adapter 120 or system disk 112. The render farm generates one or more rendered images of the scene using the provided instructions and/or data. These rendered images may be stored on computer-readable media in a digital format and optionally returned to system 100 for display.

Alternatively, CPU 102 provides display processor 108 with data and/or instructions defining the desired output images, from which display processor 108 generates the pixel data of one or more output images. The data and/or instructions defining the desired output images can be stored in system memory 104 or graphics memory within display processor 108. Display processor 108 can further include one or more programmable execution units capable of executing shader programs—such as rendering application 105, tone mapping programs, and the like.

It will be appreciated that the system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 106 and CPU 102. In other alternative topologies display processor 108 is connected to I/O bridge 110 or directly to CPU 102, rather than to memory bridge 106. In still other embodiments, I/O bridge 110 and memory bridge 106 might be integrated into a single chip. The particular components shown herein are optional; for instance, any number of add-in cards or peripheral devices might be supported. In some embodiments, switch 114 is eliminated, and network adapter 120 and add-in cards 116, 118 connect directly to I/O bridge 110.

Method to Generate 3D Model of Human Figures

As described above, embodiments of the invention provide techniques for processing pose data that corresponds to an individual in a candid pose to generate a 3D data model of the individual. Several physical features of the individual are preferably retained when generating the 3D model of the individual. Such physical features include certain aspects of the individual's body and the individual's face that are captured via the 3D camera 130 and, in some cases, HD camera 132. Additionally, rendering application 105 is configured to optionally stylize the 3D data model according to a variety of pre-defined techniques, such as morphing the head of an individual's corresponding 3D data model into a larger size (i.e., a "bobble-head").

Figure 2:
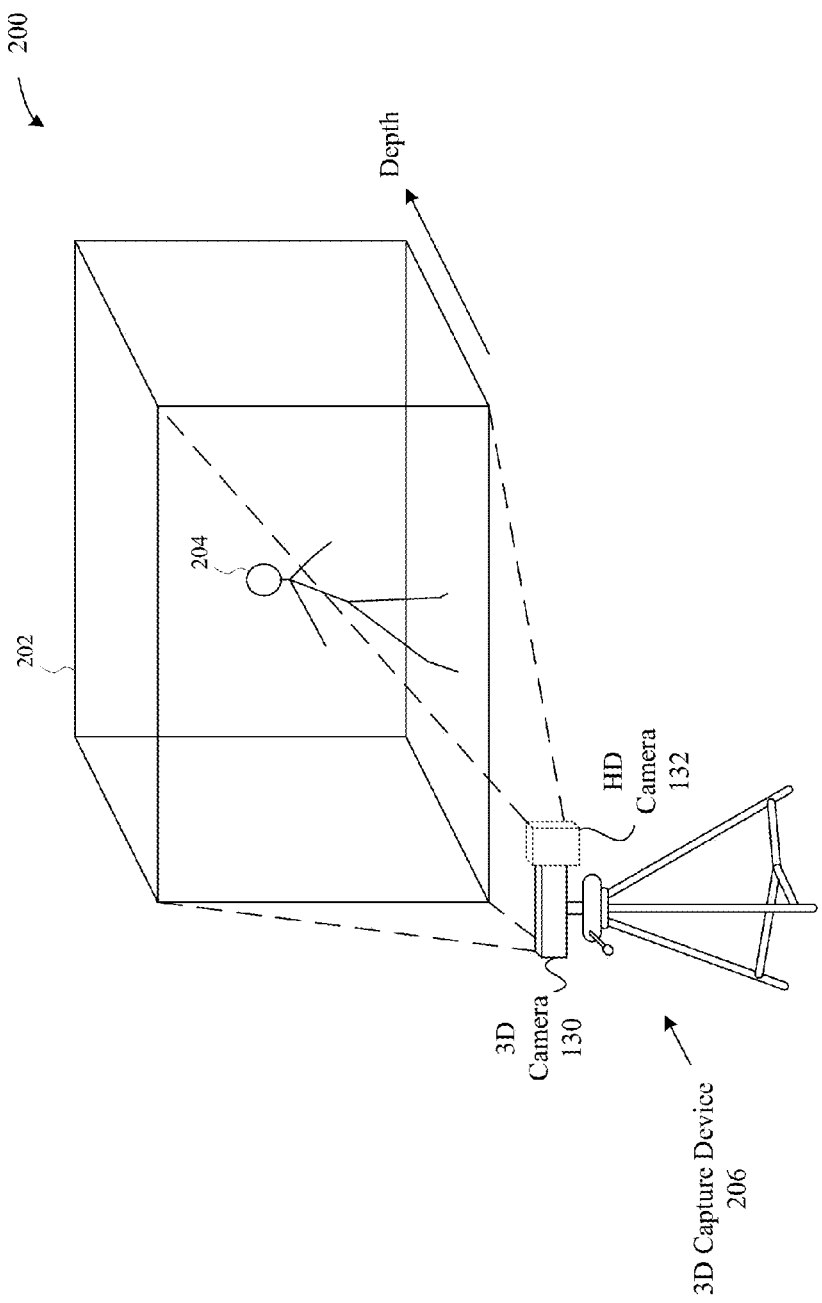
FIG. 2 is a conceptual diagram illustrating a 3D capture device that is configured to collect pose data that corresponds to a candid pose made by an individual, according to one embodiment of the invention.

FIG. 2 is a conceptual diagram 200 illustrating a 3D capture device 206 configured to collect pose data that corresponds to a candid pose made by an individual 204, according to one embodiment of the invention. As shown, a scene 202 includes the individual 204, who is striking a candid pose within the scope of 3D capture device 206, which includes 3D camera 130, and, optionally, HD camera 132. Again, the HD camera 132 may be included in 3D capture device 206 to collect an HD image that is used in place of a low-resolution RGB image that is typically provided by a consumer-level 3D camera 130. As described in detail below in conjunction with FIG. 3, 3D capture device 206 is configured to output various 3D-related data that is received and processed by rendering application 105, which then generates a 3D data model of individual 204.

Figure 3:
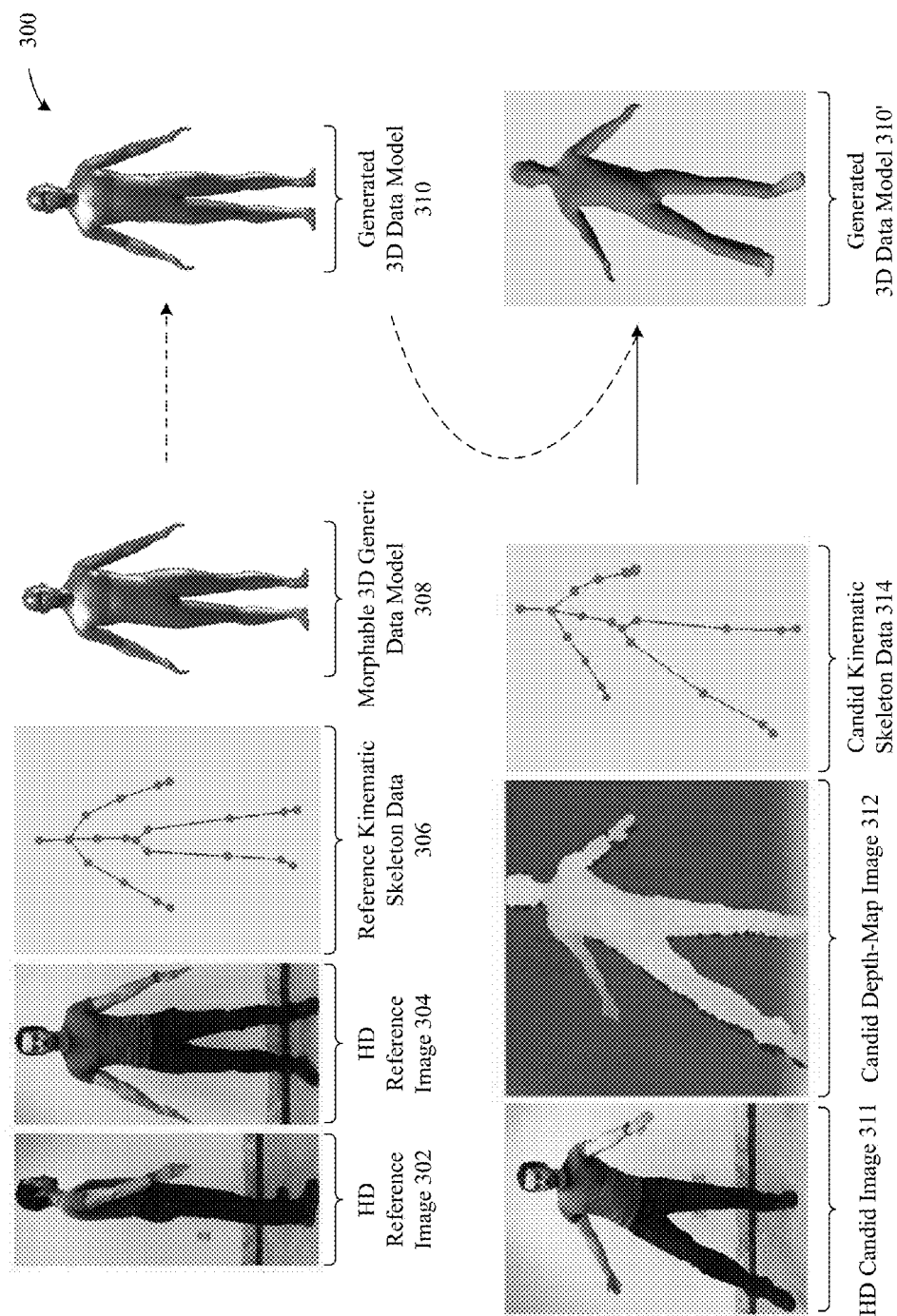
FIG. 3 is a conceptual diagram illustrating pose data that is processed by a rendering application to generate a 3D data model of an individual, according to one embodiment of the invention.

FIG. 3 is a conceptual diagram 300 illustrating pose data that is processed by rendering application 105 to generate a 3D data model of individual 204, according to one embodiment of the invention. As shown, the pose data includes HD reference image 302 and HD reference image 304, which are captured by either 3D camera 130 or HD camera 132, depending on the output resolution capabilities thereof. The pose data also includes reference kinematic skeleton data 306, which is captured by 3D camera 130 according to techniques known in the art. In one embodiment, the reference images 302-304 and the reference kinematic skeleton data 306 are captured for the purposes of a calibration process that is executed by rendering application 105 prior to generating a 3D data model of individual 204. In particular, the reference images 302-304 and the reference kinematic skeleton data 306 are used as a basis by rendering application 105 when manipulating a morphable 3D generic data model 308, which is pre-defined and included in 3D models database 113.

In another embodiment, the aforementioned calibration process is not required, and the morphable 3D generic data model 308 is manipulated according to an HD candid image 311, a candid depth-map image 312, and candid kinematic skeleton data 314. In particular, the HD candid image 311, the candid depth-map image 312 and the candid kinematic skeleton data 314 are referenced by rendering application 105 when manipulating the morphable 3D generic data model 308 to produce a generated 3D data model 310'. In this way, the individual 204 is able to forego positioning himself or herself into a reference pose, and instead needs only to position himself or herself into a candid pose, which increases efficiency.

In one embodiment, 3D models database 113 includes a male version of a morphable 3D generic data model 308 and a female version of a morphable 3D generic data model 308. The morphable 3D generic data model 308 includes various adjustable properties that play an important role when converting the morphable 3D generic data model 308 into a 3D data model 310 that can be readily compared to the individual 204 on which the 3D data model 310 is based. In one embodiment, such adjustable properties for the body of the morphable 3D generic data model 308 include a chest circumference property, a thigh circumference property, a stature property, a hip circumference property, and a waist circumference property, while adjustable properties for the head include jawbone distance property and a bridge of nose to chin distance property. Various studies have shown that attention to these properties, when manipulating the morphable 3D generic data model 308 into the 3D data model 310, results in a high degree of similarity between the individual 204 and the 3D data model. As described in detail below, such properties of the 3D data model 310 are adjusted according to data received via 3D capture device 206. For example, the manipulation of the morphable 3D generic data model 308 illustrated in FIG. 3 yields a 3D data model 310 that has features similar features to the individual 204 (e.g., leg, torso, arm and chest thickness). The details of the adjusting the 3D data model according to data received via 3D capture device 206 are described below in conjunction with FIG. 4.

Next, rendering application 105 receives pose data that corresponds to a candid pose made by individual 204. This pose data includes the HD candid image 311, the candid depth-map image 312 and the candid kinematic skeleton data 314, some or all of which are collected via 3D camera 130 according to techniques known in the art. As shown, the HD candid image 311, the candid depth-map image 312 and the candid kinematic skeleton data 314 are referenced by rendering application 105 when manipulating the generated 3D data model 310 to produce a 3D data model 310' that reflects the candid pose made by individual 204. The details of the manipulation of the generated 3D data model 310 also are described below in conjunction with FIG. 4.

Subsequently, the HD images—such as the HD reference image 302 and the HD reference image 304, or the HD candid image 311, depending on whether the rendering application 105 implements the reference pose calibration process—are processed by rendering application 105 to identify various appearance parameters of the individual 204 (i.e., hair color, facial hair, color of pants, color of shirt, and the like). In particular, rendering application 105 maps each of the identified appearance parameters to pre-defined 3D appearance objects included in 3D models 113. Again, the details of mapping the identified appearance parameters to pre-defined 3D appearance objects also are described below in conjunction with FIG. 4.

In some embodiments, the pose data may comprise volumetric data that is acquired via multiple cameras that are calibrated and work in conjunction to provide digital images that can be used by the rending software 105 to produce volumetric data of the individual in the candid pose. In one example, the system 100 has attached thereto multiple digital cameras (not illustrated) that are in different positions and at different angles relative to the scene 202. In this way, the rendering application 105 is able to stitch the digital images acquired by the multiple digital cameras into volumetric data on which a 3D data model can be generated.

In yet another embodiment, the pose data may be acquired by processing a high-resolution image from which 3D related data (e.g., kinematic skeleton data, volumetric data, and/or depth-map data) can be extracted. Such a high-resolution image is obtainable via the HD camera 132 that is attached to the system 100 and configured to acquire images of the scene 202.

Figure 4:
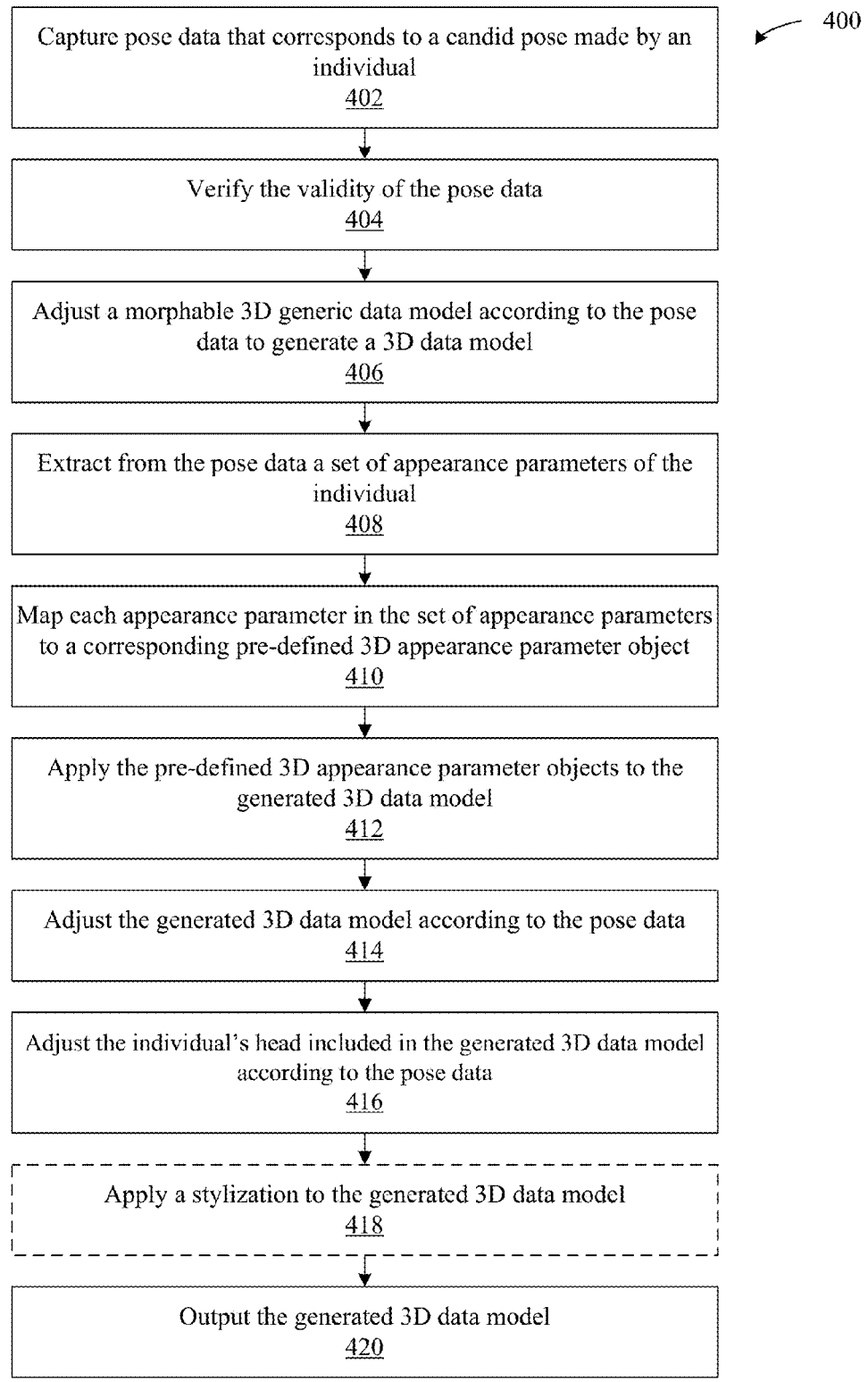
FIG. 4 is a flow diagram of method steps for processing pose data that corresponds to an individual in a candid pose to generate a 3D data model of the individual, according to one embodiment of the invention.

FIG. 4 is a flow diagram of method steps for processing pose data that corresponds to individual 204 in a candid pose to generate a 3D data model of individual 204, according to one embodiment of the invention. Persons skilled in the art will understand that, even though the method 400 is described in conjunction with FIGS. 1-4, any system configured to perform the method steps, in any order, is within the scope of embodiments of the invention.

As shown, method 400 begins at step 402, where rendering application 105 captures pose data that corresponds to a candid pose made by individual 204, i.e., HD candid image 311, candid depth-map image 312 and candid kinematic skeleton data 314. In one embodiment, rendering application 105 is configured to prompt individual 204 to first position himself or herself in a candid pose (e.g., the candid pose of the individual shown in FIG. 3).

At step 404, rendering application 105 verifies the validity of the pose data. Rendering application 105 performs this verification according to a variety of techniques, e.g., determining that individual 204 is completely within view of 3D capture device, and that an in-focus HD candid image 311, a valid candid depth-map image 312 and valid kinematic skeleton data 314 are obtained. In the event that the pose data is invalid, rendering application 105 prompts individual 204 to pose for a replacement candid pose until valid pose data is obtained.

At step 406, rendering application 105 adjusts a morphable 3D generic data model, i.e., the morphable generic data model 308 of FIG. 3, according to the pose data to generate the 3D data model 310 of individual 204. At step 408, rendering application 105 extracts from the pose data a set of appearance parameters of individual 204. In particular, rendering application 105 processes HD candid image 311 to extract the set of appearance parameters which, in one embodiment, includes skin color, hair color, and garments of individual 204. In one embodiment, rendering application 105 extracts the set of appearance parameters by projecting vertices included in the generated 3D data model 310 onto HD candid image 311 in segments that correspond to upper and lower body garments.

At step 410, rendering application 105 maps each extracted appearance parameter in the set of appearance parameters to a corresponding pre-defined 3D appearance parameter object included in 3D models 113. Examples of pre-defined 3D appearance parameter objects include garment models, hair models, skin models, and the like. In one embodiment, pre-defined 3D appearance parameter objects of garments for individual 104 (e.g., shorts vs. pants for lower body, shirt vs. t-shirt for upper body) are automatically selected by rendering application 105 based on a degree of overlap between candidate pre-defined 3D appearance parameter objects and their corresponding garments detected at step 408. Once pre-defined 3D appearance parameter objects have been selected for each of the garments, they are assigned the same colors as their corresponding garments detected at step 408. Pre-defined 3D appearance parameter objects for hair and skin are determined according to the same garment detection techniques described above.

At step 412, rendering application 105 applies the pre-defined 3D appearance parameter objects to the generated 3D data model 310. The selected pre-defined 3D appearance objects for garments are then applied to the generated 3D data model 310 by rendering application 105 and are used to accordingly deform vertices of the generated 3D data model 310. In one embodiment, pre-defined 3D appearance objects for hair and skin are applied to the generated 3D data model 310 via mean value coordinates.

At step 414, rendering application 105 adjusts the generated 3D data model 310 according to the pose data, i.e., the HD candid image 311, the candid depth-map image 312 and the candid kinematic skeleton data 314. As described above, specific head and body properties may be considered by rendering application 105 when performing the adjustments, although embodiments of the invention are not so limited. For example, as described above, in one embodiment, various properties of the body of the generated 3D data model 310 adjusted by rendering application 105 include a chest circumference property, a thigh circumference property, a stature property, a hip circumference property, and a waist circumference property. In some cases, a weight is applied to each of the properties that are adjusted, such that the generated 3D data model 310 is constructed according to Equation 1:

$$\text{3D data model 310} = \text{morphable 3D generic data model } 308 + \Sigma_{i=0}^{N_{ap}} a_i * ap_i \quad \text{Equation 1}$$

In Equation 1, $N_{ap}$ represents a total number of adjustable properties, a is a vector of weights that each correspond to a different one of the adjustable properties, and "ap" is the property included in the morphable 3D generic data model 308 that is being adjusted. In one embodiment, each weight in the a vector is a pre-defined value that is based on the importance of the corresponding adjustable property relative to the other adjustable properties. For example, in one embodiment, adjustments may be made to the each of the chest circumference property, the thigh circumference property, the stature property, the hip circumference property, and the waist circumference property, according to the weights 0.1, 0.3, 0.2, 0.3, and 0.1, respectively.

In one embodiment, rendering application 105 adjusts the generated 3D data model 310 according to skinning techniques that reference a plurality of data points included in candid kinematic skeleton data 314. Such data points are illustrated in reference kinematic skeleton data 306 and candid kinematic skeleton data 314 of FIG. 3. Rendering application 105 is also configured to fine-tune the generated 3D data model 310 by segmenting HD candid image 311 and candid depth-map image 312 to create a silhouette image.

Next, rendering application 105 generates a Chamfer distance map of zero inside of the silhouette image. Rendering application 105 additionally processes depth data included in candid depth-map image 312 to generate a 3D point cloud. The rendering application 105 then divides the candid kinematic skeleton data 314 into the following five different regions: torso, left arm, right arm, left leg, and right leg. Pose parameters of each region are separately optimized by rendering application 105. In some embodiments, the optimization is executed according to a silhouette-based term and 3D point cloud-based term. The silhouette-based term attempts to minimize the distance between each projected vertex of the generated 3D data model 310, and also between the boundaries in the silhouette image based on the generated Chamfer distance map. The 3D point cloud-based term attempts to minimize the distance between each 3D point in the 3D point cloud and the closest corresponding vertex in the generated 3D data model 310. In some cases, a higher weight is applied to the 3D point cloud-based term.

In one embodiment, rendering application 105 further processes the generated 3D data model 310 by applying a Quasi-Newton limited-memory Broyden-Fletcher-Goldfarb-Shanno (L-BFGS) method thereto, which results in a refined generated 3D data model 310 that most-accurately reflects the candid pose of the individual 204.

At step 416, rendering application 105 adjusts the individual's head included in the generated 3D data model according to the pose data. In particular, rendering application 105 identifies facial features from the HD candid image 311, such as eye and mouth positions, and adjusts various parameters of the head according to the identified facial features. In one embodiment, the various parameters adjusted by rendering application 105 include jawbone distance, and bridge of nose to chin distance. As described above, these two parameters have, through studies, been identified as facial features that, when retained in generating the 3D data model, ensure that the similarity between the individual 204 and the 3D data model remains recognizable to a high degree. In one embodiment, Equation 1 described above may be used to control the manner in which the jawbone distance and bridge of nose to chin distance are adjusted within the generated 3D data model. The optimal values for the jawbone distance and bridge of nose to chin distance are calculated by rendering application 105 by minimizing the distances between projected 3D markers from the head of the generated 3D data model and the corresponding identified facial features of individual 204. Additionally, rendering application 105 is configured to further-process the head of the generated 3D data model 310 by applying a BFGS Quasi-Newton method thereto, which results in a refined head that most-accurately reflects the head of individual 204.

Rendering application 105 is further configured to identify additional facial features of individual 204 from HD candid image 311, such as eye color, eyebrows, and lips, which are also applied to the head of the generated 3D data model 310. If individual 204 is a male, then rendering application 105 may be configured to detect a facial hair style, if any, from HD candid image 311, which is also applied to the head of the generated 3D data model 310 according to the techniques described herein.

At step 418, rendering application 105 optionally applies a stylization to the generated 3D data model 310. In one example, the generated 3D data model 310 may be modified to include a large head, giving the generated 3D data model 310 of the individual 204 a "bobble-head" appearance. In another example, rendering application 105 modifies the physique of the generated 3D data model 310 to appear muscular. Examples of the foregoing stylizations, as well as additional stylizations, are illustrated in FIG. 5 and described.

At step 420, rendering application 105 outputs the generated 3D data model 310. Subsequently, the 3D data model 310 can be used for a variety of purposes, as described herein. For example, the generated 3D data model 310 may be printed by 3D printer 134 and then inserted into a snow globe such that individual 204 may obtain a personalized snow globe souvenir of himself/herself.

Figure 5:
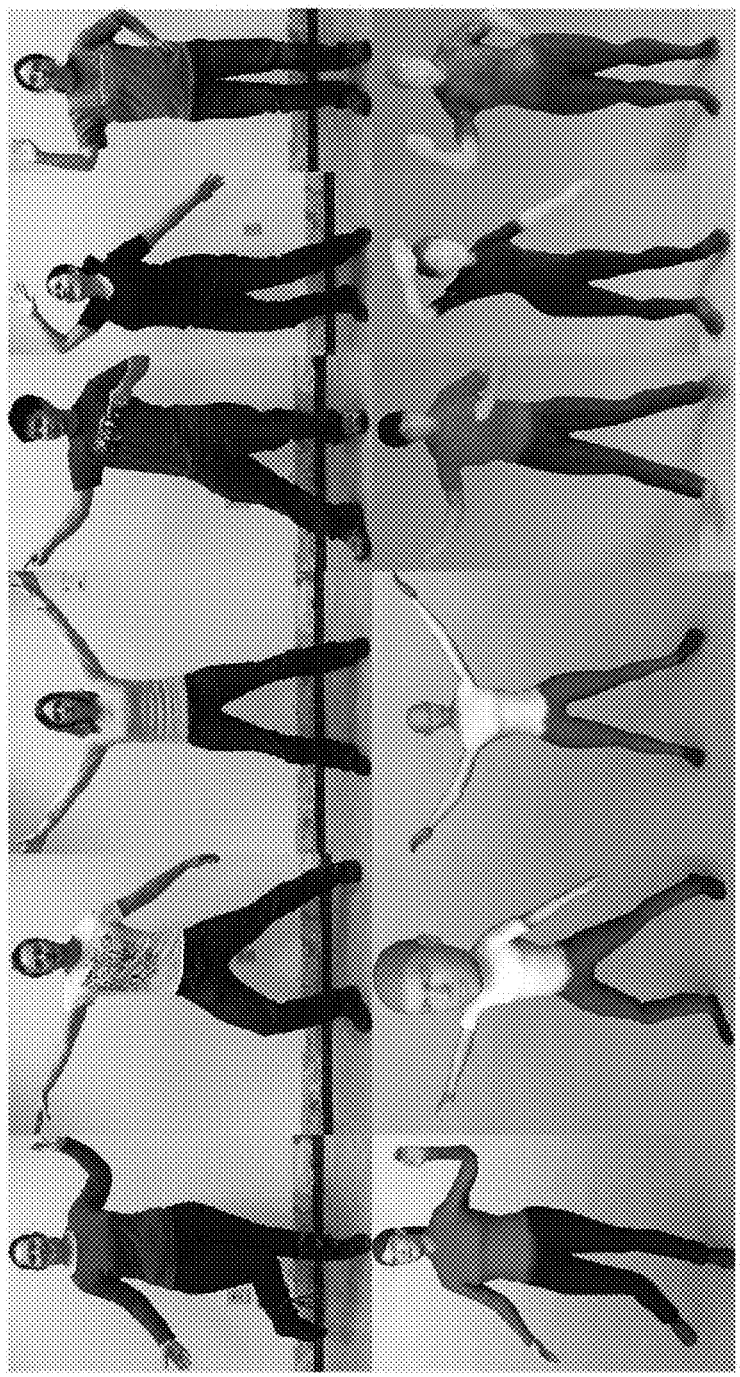
FIG. 5 shows a set of conceptual illustrations comparing various poses of individuals with corresponding 3D data models, according to one embodiment of the invention.

FIG. 5 shows a set of are conceptual illustrations comparing various poses of individuals with corresponding 3D data models, according to one embodiment of the invention. As shown, each of the generated individuals 204 have a corresponding generated 3D data model 310 that is in an electronic state (e.g., stored in a memory) or in a physical state (e.g., as a figurine). The generated 3D data model 310 has similar clothing, shoes, hair style, head and body shape, pose, etc., of the individual 204 on which the generated 3D data model is based. In this way, the association between the generated 3D data model 310 and the individual 204 can be identified not only by the individual 204, but by others. For example, friends of individual 204 playing a multiplayer game in which the generated 3D data model 310 is included as an avatar would identify the avatar as the individual 204.

In sum, embodiments of the invention provide techniques for processing pose data that corresponds to an individual in a candid pose to generate a 3D data model of the individual. In particular, the 3D data model of the individual retains important details that enable the generated small-scaled 3D data model to be recognized as the individual on whom the 3D data model is based.

One advantage of the techniques described herein is that the 3D data models may be used in a variety of applications, including being inserted as an interactive 3D avatar in virtual worlds (e.g., video games), being inserted as an animated 3D avatar in virtual worlds (e.g., animated movies), being rendered as a 3D model in a static 2D image, being projected according to 3D projection techniques (e.g., lenticular printing, holograms, 3D displays, stereograms, etc.), and being printed as toys or souvenirs using rapid prototyping systems (e.g., 3D printers that use different materials such as plastics, metals, and edibles (e.g., chocolate, sugar, etc.) from which to construct the 3D data model). Another advantage of the techniques described herein is that an individual on whom a generated 3D model is based is not required to be quasi naked in order to produce a 3D model that resembles the individual to a high degree. Yet another advantage of embodiments of the invention is that the pose data used to generate the 3D data model may be low-resolution data output by a single, inexpensive 3D camera system. As a result, the cost of the system that is configured to implement embodiments of the invention is significantly reduced. Moreover, embodiments of the invention adjust only a small number of landmarks within the 3D data model in comparison to the vast number of landmarks that are included in most 3D data models, which enables rendering application 105 to generate 3D data models in an expedited manner.

Various embodiments of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

Persons skilled in the art will understand that various modifications and changes may be made to the embodiments described herein. The foregoing description and drawings are, accordingly, to be regarded in an illustrative rather than a restrictive sense.

What is claimed is:

1. A computer-implemented method for generating a three-dimensional 3D model of a subject, the method comprising:
receiving image data, including a two-dimensional image and a depth map image, of at least a portion of the subject and an associated kinematic skeleton;
selecting a morphable generic 3D model corresponding to the subject; and
adjusting the morphable generic 3D model based on the image data and the kinematic skeleton to produce a morphed 3D model of the subject which includes one or more geometric features similar to the subject.

2. The method of claim 1, further comprising:
identifying one or more appearance parameters from the image data;
selecting an appearance parameter object corresponding to the identified appearance parameter; and
applying the selected appearance parameter object to the morphed 3D model.

3. The method of claim 1, further comprising, applying a stylization to the morphed 3D model to create a characterization of the subject.

4. The method of claim 1, wherein adjusting the morphable generic 3D model based on the image data and the kinematic skeleton to produce a morphed 3D model of the subject that has one or more features corresponding to the subject includes adjusting one or more of a chest circumference property, a thigh circumference property, a stature property, a hip circumference property, and a waist circumference property.

5. The method of claim 1, wherein the morphable generic 3D model is selected based on a gender of the subject.

6. The method of claim 1, wherein the morphable generic 3D model includes a generic head model and wherein adjusting the morphable generic 3D model based on the image data and the kinematic skeleton to produce a morphed 3D model of the subject includes adjusting one or more of a jawbone distance property of the generic head model and a bridge of nose to chin distance property of the generic head model.

7. A non-transitory computer-readable storage medium storing instructions that, when executed by a processor, cause a computer system to perform an operation to generate a three-dimensional 3D model of a subject, the operation comprising:
   receiving image data, including a two-dimensional image and a depth map image, of at least a portion of the subject and an associated kinematic skeleton;
   selecting a morphable generic 3D model corresponding to the subject; and
   adjusting the morphable generic 3D model based on the image data and the kinematic skeleton to produce a morphed 3D model of the subject which includes one or more geometric features similar to the subject.

8. The computer-readable storage medium of claim 7, wherein the operation further comprises:
   identifying one or more appearance parameters from the image data;
   selecting an appearance parameter object corresponding to the identified appearance parameter; and
   applying the selected appearance parameter object to the morphed 3D model.

9. The computer-readable storage medium of claim 7, wherein the operation further comprises, applying a stylization to the morphed 3D model to create a characterization of the subject.

10. The computer-readable storage medium of claim 7, wherein adjusting the morphable generic 3D model based on the image data and the kinematic skeleton to produce a morphed 3D model of the subject that has one or more features corresponding to the subject includes adjusting one or more of a chest circumference property, a thigh circumference property, a stature property, a hip circumference property, and a waist circumference property.

11. The computer-readable storage medium of claim 7, wherein the morphable generic 3D model is selected based on a gender of the subject.

12. The computer-readable storage medium of claim 7, wherein the morphable generic 3D model includes a generic head model and wherein adjusting the morphable generic 3D model based on the image data and the kinematic skeleton to produce a morphed 3D model of the subject includes adjusting one or more of a jawbone distance property of the generic head model and a bridge of nose to chin distance property of the generic head model.

13. A computer system, comprising:
   a processor; and
   a memory storing instructions that, when executed by the processor, perform an operation to generate a three-dimensional 3D model of a subject, the operation comprising:
      receiving image data, including a two-dimensional image and a depth map image, of at least a portion of the subject and an associated kinematic skeleton,
      selecting a morphable generic 3D model corresponding to the subject, and
      adjusting the morphable generic 3D model based on the image data and the kinematic skeleton to produce a morphed 3D model of the subject which includes one or more geometric features similar to the subject.

14. The system of claim 13, wherein the operation further comprises:
   identifying one or more appearance parameters from the image data;
   selecting an appearance parameter object corresponding to the identified appearance parameter; and
   applying the selected appearance parameter object to the morphed 3D model.

15. The system of claim 13, wherein the operation further comprises, applying a stylization to the morphed 3D model to create a characterization of the subject.

16. The system of claim 13, wherein adjusting the morphable generic 3D model based on the image data and the kinematic skeleton to produce a morphed 3D model of the subject that has one or more features corresponding to the subject includes adjusting one or more of a chest circumference property, a thigh circumference property, a stature property, a hip circumference property, and a waist circumference property.

17. The system of claim 13, wherein the morphable generic 3D model includes a generic head model and wherein adjusting the morphable generic 3D model based on the image data and the kinematic skeleton to produce a morphed 3D model of the subject includes adjusting one or more of a jawbone distance property of the generic head model and a bridge of nose to chin distance property of the generic head model.

* * * * *